(12) United States Patent
Won et al.

(10) Patent No.: US 6,962,732 B2
(45) Date of Patent: Nov. 8, 2005

(54) PROCESS FOR CONTROLLING THIN FILM UNIFORMITY AND PRODUCTS PRODUCED THEREBY

(75) Inventors: Tae Kyung Won, San Jose, CA (US); Takako Takehara, Hayward, CA (US); William R. Harshbarger, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/938,435

(22) Filed: Aug. 23, 2001

(65) Prior Publication Data

US 2003/0044621 A1 Mar. 6, 2003

(51) Int. Cl.[7] ............................ C23C 16/46; H05H 1/24; B05D 5/12
(52) U.S. Cl. .................... 427/578; 427/58; 427/255.14; 427/255.18; 427/579; 427/585; 427/588; 438/680
(58) Field of Search ............................ 427/578, 255.14, 427/58, 585, 588, 255.18, 579; 438/680, 332; 118/723, 724

(56) References Cited

U.S. PATENT DOCUMENTS

| | | | |
|---|---|---|---|
| 5,098,865 A | * 3/1992 | Machado et al. ............ 437/238 |
| 5,156,820 A | * 10/1992 | Wong et al. ............ 422/186.05 |
| 5,534,072 A | 7/1996 | Mizuno et al. |
| 5,795,833 A | 8/1998 | Yu et al. ...................... 438/763 |
| 5,844,205 A | 12/1998 | White et al. |
| 5,958,140 A | 9/1999 | Arami et al. ................ 118/725 |
| 5,977,519 A | 11/1999 | Sorensen et al. |
| 6,143,666 A | * 11/2000 | Lin et al. ..................... 438/725 |
| 6,225,601 B1 | * 5/2001 | Beer et al. ................... 219/390 |
| 6,352,594 B2 | * 3/2002 | Cook et al. ................. 118/724 |
| 6,427,623 B2 | * 8/2002 | Ko .......................... 118/723 E |
| 6,451,390 B1 | * 9/2002 | Goto et al. ................... 427/579 |

FOREIGN PATENT DOCUMENTS

| | | |
|---|---|---|
| EP | 0412 644 A2 | 2/1991 |
| EP | 0 418 541 A2 | 3/1991 |
| EP | 0862 352 A2 | 9/1998 |
| JP | 10144665 | 5/1998 |
| WO | WO 00/02824 A1 | 1/2000 |
| WO | WO 00 29799 | 5/2000 |
| WO | PCT/US 02/26456 | 12/2002 |

OTHER PUBLICATIONS

Ekbundit et al., Characterization of film uniformity in LPCVD TEOS Vertical Furnace, 2002 IEEE/SEMI Advanced Semiconductor Manufacturing Conference, pp. 38–42.*

Lee et al., The Effect of Patterned Susceptor on the Thickness Uniformity of Rapid Thermal Oxides, IEEE Transactions on Semiconductor Manufacturing, vol. 12, No. 3, pp. 340–344.*

Hajjar et al., entitled *"Structural and Electrical Properties of Polycrystalline Silicon Films Deposited by Low Pressure Chemical Vapor Deposition with and Without Plasma Enhancement,"* Journal of Electronic Materials, vol. 15, No. 5, 1986.

* cited by examiner

*Primary Examiner*—Monique R. Jackson
(74) *Attorney, Agent, or Firm*—Robert J. Stern

(57) ABSTRACT

Processes for controlling thickness uniformity of thin organosilicate films as they are deposited on a substrate, and as they finally result. During deposition of the film, which may be accomplished by CVD, PECVD, rapid thermal processing or the like, the substrate temperature is controlled to establish a temperature profile particularly suited to the extreme temperature sensitivities of the deposition rates of organosilicate films such as those deposited from TEOS as a source material.

39 Claims, 7 Drawing Sheets

PROCESS FOR CONTROLLING THIN FILM UNIFORMITY AND PRODUCTS PRODUCED THEREBY

FIELD OF THE INVENTION

The present invention relates generally to thin film deposition processes, and more particularly to controlling the processes to improve thickness uniformity of thin films deposited on large surface area applications.

BACKGROUND OF THE INVENTION

Thin film uniformity (i.e., substantially constant thickness of the film throughout) is an important criterion in the production of semiconductor and LCD devices, to obtain good performance and viable components over the entirety of a work piece. A susceptor is a mechanical part that holds a substrate in a processing chamber for a fabrication step, such as chemical vapor deposition (CVD), plasma enhanced chemical vapor deposition (PECVD) or physical vapor deposition (PVD), for example. The susceptor includes a substrate mounting plate mounted on a stem, along with a lift assembly for raising and lowering the substrate within the processing chamber. The substrate mounting plate is heated to facilitate the fabrication process. Typically, a heating element is disposed within the mounting plate. Most films deposited by CVD are deposited with source materials in a process chamber into which at least one of several types of energy (e.g., plasma, thermal, microwave) are inputted to facilitate the deposition process. The source materials are, of course, dependent upon the type of layer to be deposited, and may include gaseous materials such as $SiH_4$, $H_2$, $N_2$, $NH_3$, $PH_3$, $CH_4$, $Si_2H_6$, and $O_2$; and/or liquid source materials which may include metal ions and organosilicate components like TEOS, for example. The films are very sensitive to temperature conditions as they are being deposited, especially those deposited with an organosilicate liquid source, since the vapor pressures of the organosilicate liquid sources are highly temperature dependent. Consequently, temperature control is a key factor in achieving film consistency when depositing thin films on large surface area substrates, such as glass plates used in the flat panel industry.

In contrast to depositions on semiconductor wafers, which occur on a relatively small scale (even the move from 200 mm to 300 mm is small in comparison with substrates used in the flat panel industry, which can run from 550 mm×650 mm and upwards of 1 m×1.2 m) depositions performed on large scale flat panel substrates have an additional set of problems to be addressed which are not critical when depositing on semiconductor wafers. A major difference is that the flat panel substrates are generally glass, which is significantly less thermally stable than a silicon wafer. Glass substrates, as opposed to silicon wafers cannot be processed above about 600° C. since too much structural stability is lost above this temperature as the glass begins to liquefy. Coupling this problem with the large surface area of the flat panels gives rise to serious concerns over bowing or sagging of the substrate in the middle portion thereof during processing at elevated temperatures. Additionally, the relatively small surface area of a semiconductor wafer facilitates the striking of a small, tightly controlled plasma for PECVD processes, whereas control and consistency of a plasma over an entire flat panel is much more challenging.

In this regard, the uniform deposition of organic components, TEOS in particular, to form organosilicate films on flat panels has proven extremely problematic, as research over the last five years has not yet been successful in providing a solution for manufacturing thin organosilicate films, using TEOS as a precursor, on flat panels of 550×650 mm or greater with $\leq 10\%$ film uniformity.

As the substrate size increases, temperature control of the film deposition processes becomes even more critical because of the larger surface area and greater temperature variances across the face of the substrate, compared to what occurs with a substantially smaller substrate. Further, in examples such as flat panels, the film uniformity is a key property in determining thee performance of the product, since substantially the entire substrate may be used as the final product, as compared with an example of a semiconductor wafer, which is divided into many components and therefore each final component is only dependent upon the uniformity of the film in a much smaller area in and immediately around a portion of the wafer.

Generally, the susceptors in the prior art include a single heating element that inputs energy to the susceptor (and thus the substrate) as a whole, with feedback to vary the temperature of the substrate by varying the input through the heating element. U.S. Pat. No. 5,977,519 discloses a susceptor having dual heating elements with dual and generally parallel loops, to provide for a generally radially symmetric temperature distribution across the mounting plate while allowing for heat losses at the outside surface. However, this patent does not address the temperature dependence of the films, particularly the organosilicate films, but merely aims to compensate for heat losses at the outside surface, so as to maintain a generally even heating of the substrate.

Similarly, U.S. Pat. No. 5,844,205 discloses a substrate support structure that includes a pair of heating elements arranged in inner and outer loops so that the perimeter of the support structure may be heated to a higher temperature than the interior, for example. This control is performed to compensate for the greater heat losses that are experienced at the perimeter of the support structure. Thus, the goal of the control is to attempt to provide a uniform substrate temperature by compensating with additional heating of the substrate near the perimeter. However, similar to U.S. Pat. No. 5,977,519, this patent does not address the temperature dependence of the films, particularly organosilicate films, but merely aims to compensate for heat losses at the outside surface so as to maintain a generally even heating of the substrate.

U.S. Pat. No. 5,534,072 discloses a multi-chamber CVD processing system in which multiple lamp heaters are positioned in back of a substrate and provided with separate power controllers to vary the light supplied by each lamp heater in an effort to attain uniform temperature over the entire substrate surface. Additionally, a stepped area is machined on the susceptor surface that is in contact with the substrate. By controlling the step-machined region and its depth, the disclosure indicates that it is possible to make the temperature distribution on the substrate surface more uniform. As with the previously discussed patent, the goal of this patent is also to achieve temperature uniformity over the substrate during processing. This patent does not address the temperature dependence of the film, particularly the organosilicate films, in any way other than to generally discuss that temperature uniformity is desirable.

U.S. Pat. No. 6,225,601 discloses a technique for heating a susceptor in which the temperatures of first and second heating elements are controlled so that the difference between the temperatures of the first and second heating elements does not exceed a predetermined value while the temperatures of the heating elements are raised to their respective final temperature setpoints. Thus, this patent is directed primarily to a control system for controlling the relative temperatures between heating elements as they are heated up. This patent does not address the temperature dependence of organosilicate films, much less those films formed using TEOS.

With the trend being to move to larger and larger flat panels, improved temperature controls are needed to insure that well-performing products are achieved through film deposition processes. A need remains for a solution that will consistently produce relatively uniform thin films of organosilicate films, and particularly those formed using TEOS as a precursor, on relatively large scale substrates, such as flat panels.

SUMMARY OF THE INVENTION

The present invention is directed toward the improvement of thin film thickness uniformity over the entirety of a deposited thin film. A method of controlling thickness uniformity of a film deposited on a substrate may include the steps of providing a substrate in a processing chamber; controlling a temperature of at least two distinct locations on the substrate to include a perimeter area of a surface of the substrate and an area of the surface inside of the perimeter area; maintaining the temperature of the perimeter area of surface of the substrate within a range between about 10° C. less than the temperature of the area of the surface inside of the perimeter area to about 20° C. higher than the temperature of the area of the surface inside of the perimeter area; and depositing the organosilicate film, wherein the organosilicate film deposited has a film uniformity less than or equal to about 10%.

The temperature of the perimeter area of the surface may be controlled by a first heater element in a susceptor and underlying the perimeter area of the substrate, and the temperature of the area of the surface inside of the perimeter area is controlled by a second heater element in the susceptor and underlying the area inside of the perimeter area, said controlling comprising maintaining the temperature of the perimeter area within a range of about 380° C. to about 410° C., while maintaining the area inside of the perimeter area at about 390° C.

In one example, the organosilicate film is formed using TEOS as a precursor, and the deposition of the organosilicate layer is controlled by maintaining the temperature of the perimeter area at about 390° C. while maintaining the areas inside of the perimeter at about 390° C. In another example the temperature of the perimeter area is controlled to greater than 390° C. to about 400° C. while maintaining the area inside of the perimeter at about 390° C. In another example, the temperature of the perimeter area of the substrate is maintained at greater than 400° C. to about 410° C. while maintaining the area inside of the perimeter at about 390° C.

Substantially uniform thin organosilicate films, may be produced using TEOS according to the invention by maintaining the temperature of the perimeter area of a substrate, during deposition, at about 390° C. to 410° C. while maintaining the area inside of the perimeter at about 390° C.

In other examples involving deposition on substrates having dimensions of 730 mm×920 mm, the temperature control comprises maintaining the temperature of the perimeter area within a range of about 350° C. t about 460° C., while maintaining the area inside of the perimeter area within a range of about 340° C. to about 450° C., while maintaining the temperature of the perimeter area of a surface of the substrate within a range between about 10° C. less than the temperature of the area of the surface inside of the perimeter area to about 20° C. higher that the temperature of the area of the surface inside of the perimeter area.

Methods of depositing thin organosilicate films according to the invention may include chemical vapor deposition, PECVD, PVD, rapid thermal processing and other known deposition methods.

A particular example of a thin film deposition is described using TEOS as the source material, although the present invention applies to a wide variety of thin films that may be deposited in connection with semiconductor and flat panel technologies, for example.

Thin films having improved thickness uniformity are also a subject of the present invention.

These and other objects, advantages, and features of the invention will become apparent to those persons skilled in the art upon reading the details of the invention as more fully described below.

BRIEF DESCRIPTIONS OF THE DRAWINGS

Figure 7:
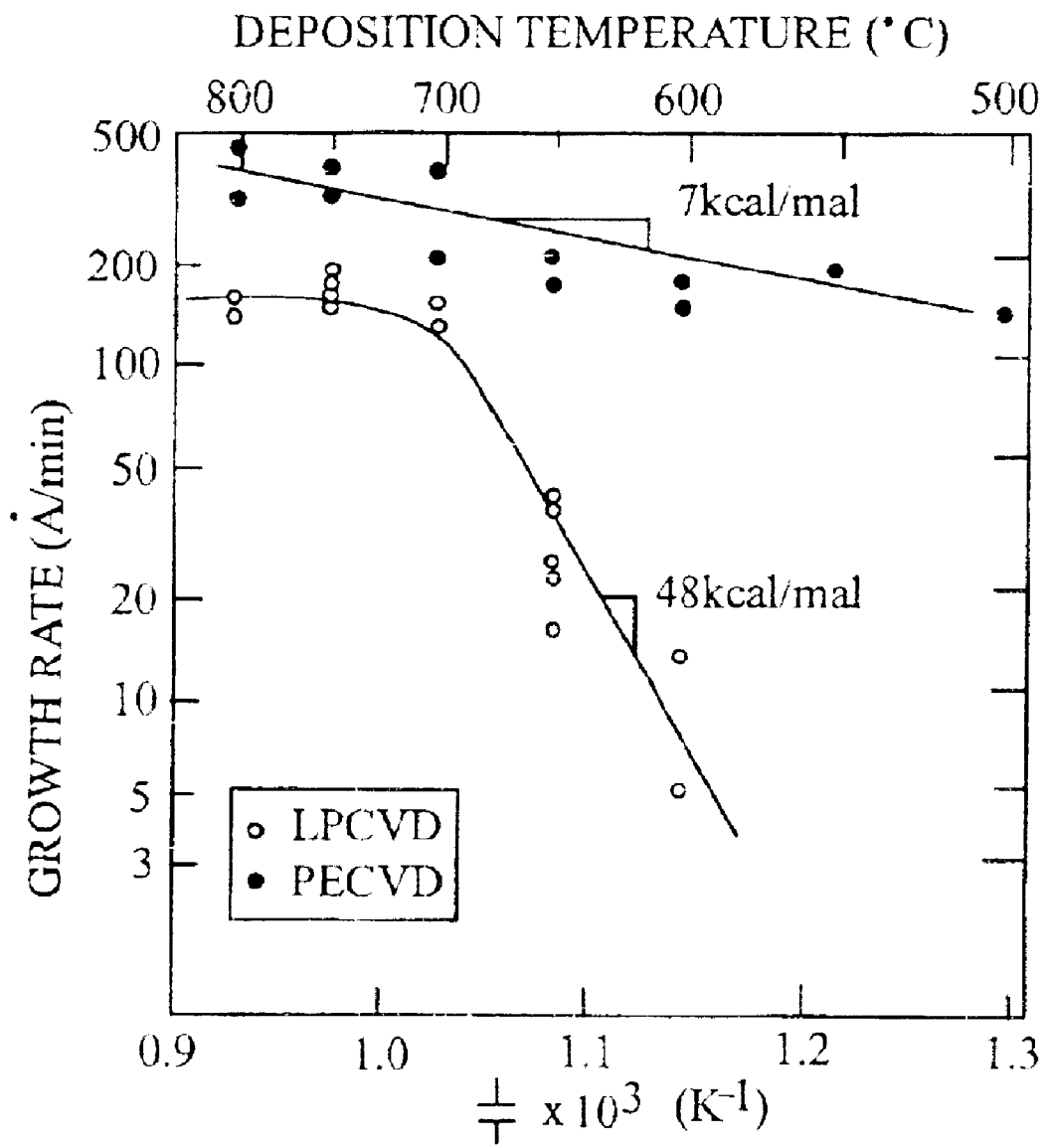

FIG. 7 is a graph showing logarithmic ($\log_{10}$) plots of deposition rates of polycrystalline silicon thin films deposited on oxidized silicon substrates using PECVD (dark circles) and low pressure CVD (without plasma enhancement) (white circles). (see Haijar, J.-J.; Reif, R.; and Adler D.: *J. Electronic Mat.*, 15, 279 (1986).

Figure 8:
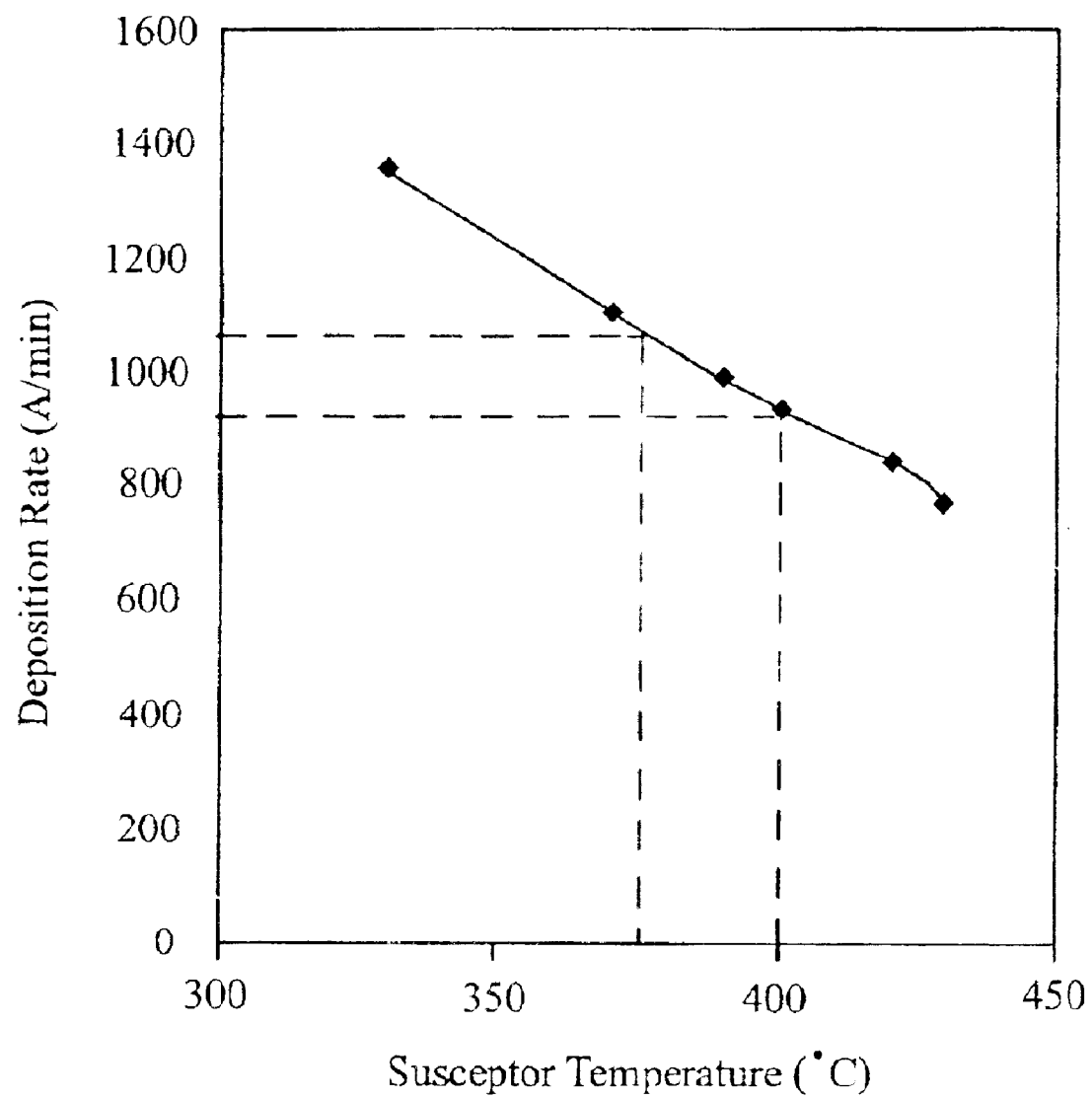

FIG. 8 is a graph showing the linear relationship between temperature change and deposition rates of an organosilicate film using TEOS as a source material.

DETAILED DESCRIPTION OF THE INVENTION

Before the present techniques and films are described, it is to be understood that this invention is not limited to particular methods of deposition or films described, as such may, of course, vary. It is also to be understood that the terminology used herein is for the purpose of describing particular embodiments only, and is not intended to be limiting, since the scope of the present invention will be limited only by the appended claims.

Where a range of values s provided, it is understood that each intervening value (to the tenth of the unit of the lower limit unless the context clearly dictates otherwise) between the upper and lower limit of the range and any other stated or intervening value in that stated range is encompassed within the invention. The upper and lower limits of these smaller ranges may independently be included in the smaller ranges also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "and", and "the" include plural referents unless the context clearly dictates otherwise. Thus, for example, reference to "a film" includes a plurality of such films and reference to "the heater element" includes reference to one or more heater elements and equivalents thereof known to those skilled in the art, and so forth.

The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed.

DEFINITIONS

The term "substrate" broadly covers any object that is being processed in a process chamber. The term "large substrate" refers to substrates larger than 300 mm wafers and includes, for example flat panel displays or glass plates.

The term "film uniformity" refers to the maximum variance in thickness of the minimum or maximum thickness of the film from the average thickness of the film, as a percentage. The film thicknesses are generally measured at distinct locations along the diagonals (when the application is a flat panel) of the substrate while excluding a perimeter area having a width of about 10 mm.

The following abbreviations are used throughout the specification:
CVD is used for chemical vapor deposition.
PECVD is used for plasma enhanced chemical vapor deposition.
TEOS is an acronym designating tetraethoxysilane.

The present invention is directed to improving film thickness uniformity both during and after the deposition of a thin film on a substrate. In the examples described below, thin films are deposited in a CVD chamber, with particular attention being paid to the deposition of organosilicate films using TEOS as a precursor. However, it is noted that the present invention, although very advantageously used in the CVD deposition of organosilicate films from TEOS, is not limited to such, and may be practiced with other films, such as metallic films, silicon films and other organosilicate films, for example, and may also be practiced in other sorts of processing chambers, such as chambers which carry out rapid thermal processing or physical vapor deposition, for example. Many of the details described are specific to the implementation described and may be changed as known by those skilled in the art.

CVD includes a group of processes known and used in the art for, among other things, depositing a thin film layer onto a substrate. In general, the substrate is supported in a vacuum deposition process chamber, and the substrate is heated to several hundred degrees Centigrade. Deposition gases and/or liquids are injected into the chamber, and a chemical reaction occurs to deposit a thin film layer onto the substrate. The thin film layer may be a dielectric layer (such as silicon nitride, silicon oxide or organic silicon oxides and the like), a semiconductor layer (such as amorphous silicon) or a metal layer (such as tungsten). The deposition process may be plasma enhanced or thermally enhanced.

Figure 1:
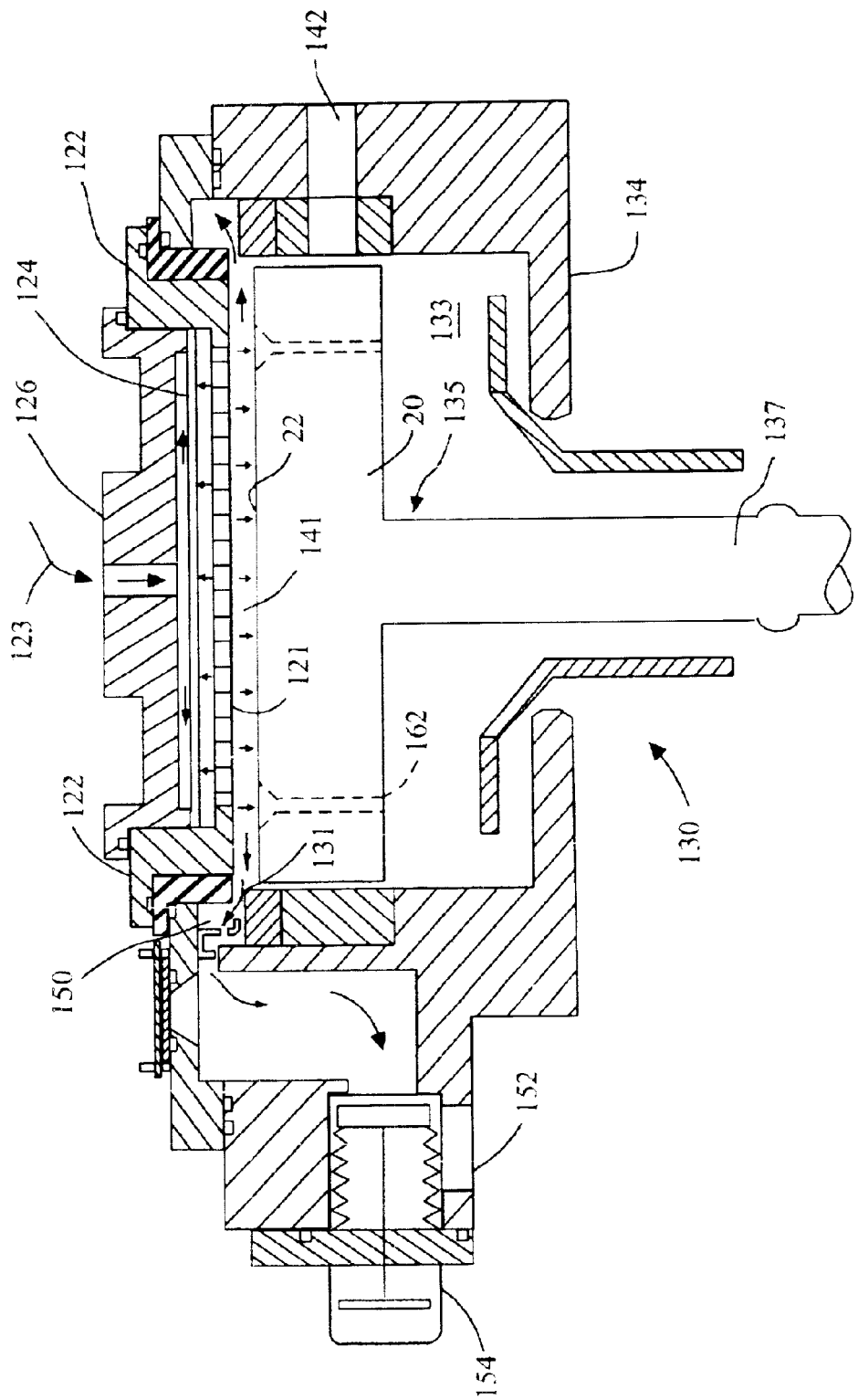
FIG. 1 is a cross-sectional view of a CVD processing chamber which may be used to practice the present invention

As shown in FIG. 1, a CVD apparatus 130 includes a susceptor 135 having a substrate mounting plate 20 mounted on a stem 137. The susceptor 135 is positioned within a vacuum deposition process chamber 133. An upper face 22 of the mounting plate 20 supports a substrate, such as a glass panel (not shown), in a substrate processing or reaction region 141. A lift mechanism (not shown) is provided to raise and lower the susceptor 135. Lift pins (not shown) may pass through lift pin holes 162 in the mounting plate 20 to facilitate the transfer of substrates into and out of the chamber 133 through an opening 142 in a sidewall 134 of the chamber 133 by a robot blade (not shown).

Deposition process precursor material(s) (gases and/or liquids, indicated by arrow 123) flow into the chamber 133 through an inlet manifold 126. The precursor material(s) then flow through a perforated blocker plate 124 and holes 121 in a process gas distribution faceplate 122 (indicated by small arrows in the substrate processing region 141 of FIG. 1). The upper face 22 of the mounting plate 20 is parallel and spaced-closely to the faceplate 122. A radio frequency (RF) power supply (not shown) may be used to apply electrical power between the gas distribution faceplate 122 and the susceptor 135 so as to excite the process gas/liquid mixture to form a plasma. The constituents of the plasma react to deposit a desired film on the surface of the substrate on the mounting plate 20.

The deposition process gases may be exhausted from the chamber through a slot-shaped orifice 131 surrounding the reaction region 141 into an exhaust plenum 150. From exhaust plenum 150, the gases flow by a vacuum shut-off valve 152 and into an exhaust outlet 154 which connects to an external vacuum pump (not shown).

Figure 2A:
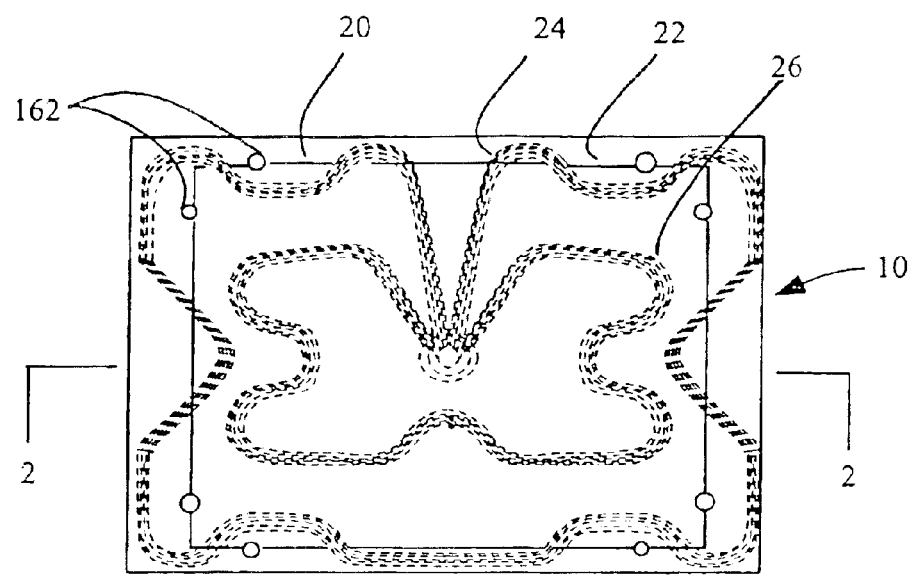
FIG. 2A is a top view of a substrate mounting plate, or susceptor, according to the present invention.

Referring to FIG. 2A, a top view of the upper surface 22 of the substrate mounting plate 20 of susceptor 137 is shown. As noted, the upper face 22 of mounting plate 20 is configured to support a substrate 10 (shown in phantom) upon which the film is to be deposited. The mounting plate 20 may be a rectangular shaped body fabricated of high purity 100.1 grade, anodized, cast aluminum, as shown, for flat panel applications, for example. Other shapes and sizes may of course be constructed as suitable for their specific applications. An outer heating element 24 and an inner heating element 26 (both shown in phantom) are disposed beneath the surface 22 of the mounting plate 20. For ease of understanding, the heating elements are shown in FIG. 2A even though they are located beneath the top surface 22 and would not be visible.

Figure 2B:
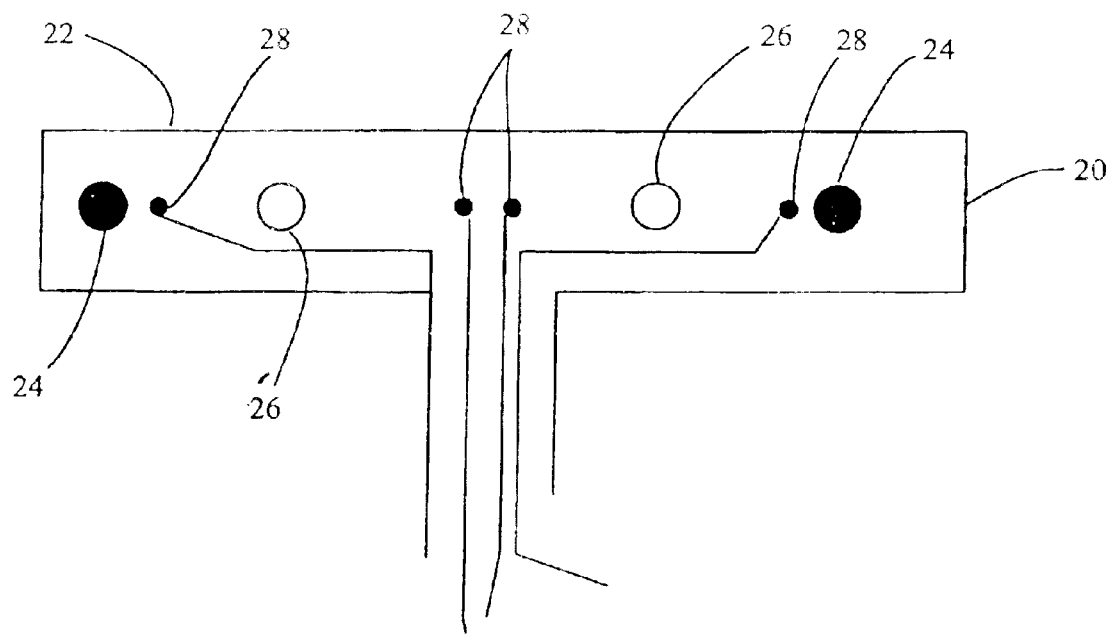
FIG. 2B is a schematic, sectional view of the substrate mounting plate of FIG. 2A, taken along line 2—2.

The heating elements 24 and 26 may provide dual and generally parallel loops. This dual loop pattern provides for a generally radially-symmetric temperature distribution across the mounting plate 20, while allowing for anomalies that would be presented in the locations of the lift pin holes 162. The heating elements are separately controllable and are monitored by independent thermocouples 28, each thermocouple 28 being located in a position representative of the area to which each respective heating element supplies energy. At least one thermocouple is provided for each heating element respectively. In the example shown in FIG. 2B, two thermocouples 28 are provided in the vicinity of each of heater elements 24 and 26, respectively. One thermocouple is used to provide the feedback signal for controlling each respective heating element, and the other is a backup, should the first thermocouple fail. This independent control arrangement allows the peripheral area of the susceptor, and thus the peripheral area of the substrate to be controlled independently of the inner area by controlling the input of outer circuit 24, while the temperature of the inner area of the substrate is controlled and monitored by input through the inner circuit 26 and monitoring of the associated thermocouple(s). Other heating element configurations, of course, are possible, including the provision of greater than two independently controllable heater element circuits.

Heating elements 24 and 26 may be identical in construction, differing only in length and positioning in the mounting plate 20. Heating elements 24 and 26 may each include an electrically-conductive outer sheath, a heating filament and an electrically-insulative and thermally-conductive sealing material disposed therebetween, as is known in the art. In operation, the sealing material prevents the burn-out or short-circuiting of the heating filament by providing a thermally-conductive but electrically-insulative filler between the filament 32 and the outer sheath 30. Heat from the filament is conducted by the sealing material to the outer sheath, and heat from the outer sheath is conducted to the mounting plate 20 to heat a substrate supported thereon. The outer sheath may be constructed of a thermally and electrically conductive material such as a metal. Specifically, the outer sheath may be stainless steel or incoloy. The filament may be constructed from a nichrome wire, which is a composite of nickel and chromium. The sheath may have an outer diameter D which may be about 0.220 to 0.314 inches.

The sealing material may be composed of substantially pure diamond powder, such as an industrial grade diamond material available from, for example, Beta Diamond Products, of Yorba Linda, Calif. The diamond powder may be composed of particles having an average particle size between about five and fifty microns. Most of the particles may have a particle size of about fifteen and thirty microns. Alternatively, the sealing material may be composed of a ceramic material such as magnesium oxide or boron nitride, for example, or of a mixture of a diamond powder and a ceramic material such as magnesium oxide or boron nitride.

The heating elements 24 and 26 may be constructed according to conventional techniques. In brief, a filament is positioned in the center of an empty sheath. One end of the sheath is sealed, a sealing material is poured into the sheath, and the assembly is shaken to settle the sealing material. Then the other end of the sheath is sealed, and the assembly is drawn through a set of pressurized rollers to compact it. Finally, the heating element is bent into the desired shape.

Referring again to FIG. 1, the mounting plate 20, as noted, is attached to the stem 137 of the susceptor 135. The mounting plate 20 may include a top plate, a base plate, and a braised region therebetween (not shown). Disposed in the mounting plate 20 between the top plate and base plate are the heating elements 24 and 26 (see also FIG. 2B). The stem 137 includes a hollow core and is configured to mate with the base plate of the mounting plate 20. A vacuum tight joint is made such that the inside of the hollow core is at ambient (atmospheric) pressure. In this example, four heating element tubes (not shown) are disposed within the hollow core of the stem 137. Each heating element tube includes a conductive lead wire (not shown) for attachment to an end of a filament of a heating element. In addition, the stem 137 holds two grounding wires (not shown) for attachment to the outer sheath of each heating element. The heating element tubes are terminated at the end of the stem 137, and the lead wires are connected to a heater controller (not shown), which in turn powers the heating elements and monitors the temperature of the mounting plate. Two lead wires for each heating element are connected to the heater controller to run a current through the filament of the heating element. Each heating element is separately controllable by the controller and is also provided with independent feedback means in the form of one or more thermocouples (two, in the example shown in FIG. 2B), so that the temperature in the area surrounding each heating element can be monitored independently by the controller. In addition, the ground wire is connected to a ground to ground the sheath of each heating element, respectively. The grounded outer sheath prevents the current flowing through the filament from disturbing any plasma in the substrate processing region.

Figure 3:
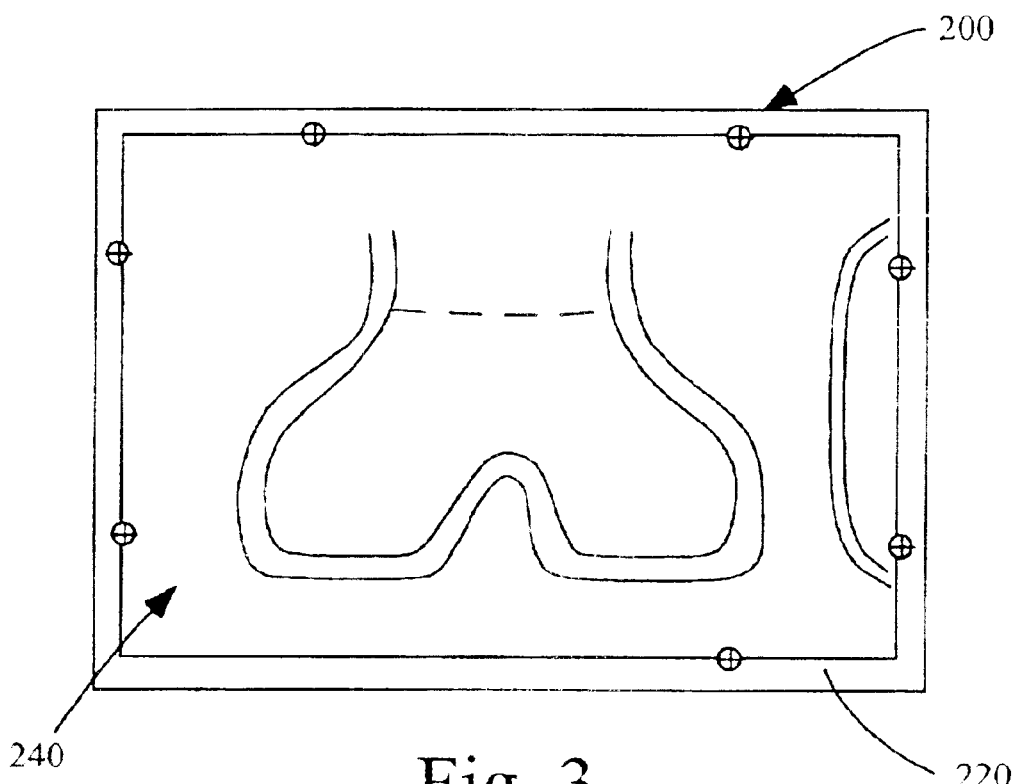
FIG. 3 is a top view of a prior art susceptor employing a single heater line throughout to heat the entire susceptor plate surface.

FIG. 3 shows a top view of an example of a prior art susceptor having a mounting plate 200 with an upper surface 220 which is designed to support a substrate for deposition of a film thereon. A single heating element 240 is disposed beneath the surface 220 of the mounting plate 200 for heating the surface 220 and the substrate when it is supported thereon. For ease of understanding, the heating element 240 is shown (in phantom) even though it is located beneath the top surface 220 and would not be visible. Due to the provision of only one heating circuit 240, no differential heating control of the surface 220 is possible. During a CVD deposition process, the chamber walls 134 are not independently heated or directly heated in any manner. Assuming that the chamber exists in a room at room temperature, which is generally the case, the chamber walls will then generally be significantly cooler than the susceptor mounting plate and the substrate. For this reason, it is known that a temperature gradient can exist in a radially outward direction from the center of the substrate during the deposition process.

Figure 5:
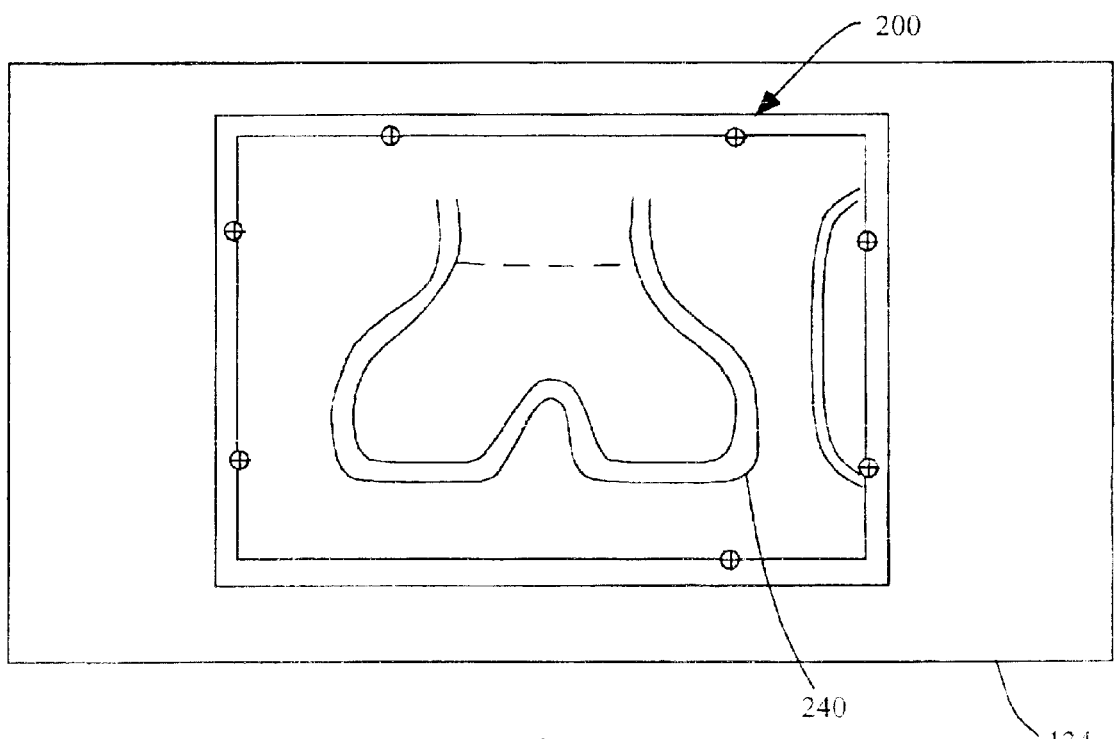
FIG. 5 is a view of the susceptor of FIG. 3 with a schematic representation of a chamber wall surrounding the susceptor.

For example, referring to FIG. 5, the outside surface of a chamber wall 134 has been measured to be about 100° C. during a vapor deposition process in which the heat element 240 is controlled to a thermocouple reading of about 400° C. In this case, while the center of the substrate may have a temperature of about 350° C. during the deposition (the actual substrate temperature is about 50° C. lower than the reading by the thermocouple), the periphery of the substrate, being much closer to the walls 134 of the chamber, will experience greater heat losses, and it would not be unusual to measure a temperature approaching 330° C. on the periphery of some substrates. With the configuration shown in FIG. 5, the temperature of the periphery of the substrate can only be increased by increasing the input through the single heater element 240. This action however, will of course increase the temperature of the interior area or the substrate concomitantly and the temperature gradient problem will not be corrected, since the center area of the substrate will always be hotter than the peripheral area of the substrate with such an arrangement.

For this reason, there have been approaches in the art directed toward improving the temperature distribution along a substrate by providing more than one heat source per susceptor, as have been described above. However, these approaches have been directed at maintaining constant temperature distribution, to overcome inconsistencies in the temperature distribution due to the configuration of the susceptor plate, the areas of contact between the susceptor plate and substrate, and to heat losses at the periphery, for example.

The present inventors have determined that thin layers deposited on substrates are temperature dependent for their thickness uniformity properties, in varying degrees, depending upon the composition of the layer that is deposited. Organosilicate layers, such as those produced using TEOS as a source material, for example, are particularly susceptible to the influences of temperature on deposition rates. Whereas the deposition rates for amorphous silicon and silicon nitrides increase with increasing temperature, the deposition rate for TEOS decreases with increasing temperature with the deposition rate also being much more temperature sensitive with changes in temperature than that of amorphous silicon or silicon nitrides. That is, the change in deposition rates for amorphous silicon or silicon nitrides is exponentially related to changes in temperature, while for organosilicate films, such as those produced using TEOS, for example, the relationship is linear.

FIG. 7 shows logarithmic ($log_{10}$) plots of deposition rates of polycrystalline silicon thin films deposited on oxidized silicon substrates using PECVD (dark circles) and low pressure CVD (without plasma enhancement) (white circles) (see Haijar, J.-J.; Reif, R.; and Adler D.: *J. Electronic Mat.*, 15, 279 (1986). Referring to the PECVD plot, it can be observed that an increase in deposition temperature from about 500° C. to about 550° C. results in an increase in deposition rate from about 150 Å/min to about 180 Å/min.

FIG. 8, in comparison, shows the linear relationship between temperature change and deposition rates of organosilicate films using TEOS a source material. This plot shows that, for example, an increase in susceptor temperature from about 350° C. to about 400° C. results in a decrease in the deposition rate of from about 1050 Å/min to about 900 Å/min. As can be seen, the organosilicate film deposited using TEOS as a precursor is very temperature sensitive and requires very particular attention in order to achieve substantial film uniformity in a deposited film.

Rather than setting a uniform temperature distribution across the substrate, as an ideal surface for a uniform thin layer distribution, the present inventors have determined that controlling the peripheral area of the substrate to have a somewhat higher temperature than the inner area of the substrate will result in the application of a thin layer that is more nearly uniform than the case where a thin layer is deposited on a substrate having a uniform temperature across the entire substrate. This effect is most pronounced with the organosilicate liquid precursors, whose vapor pressure are very temperature dependent, although the same relationship is seen, although to a lesser extent for other precursor liquids and gases.

Figure 4:
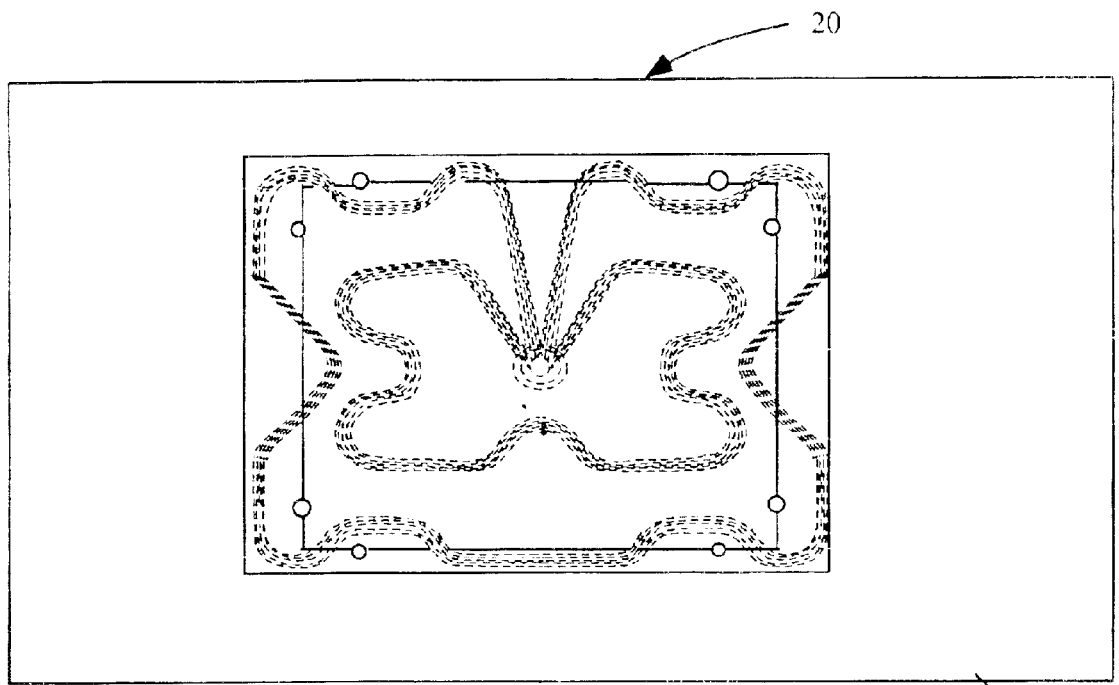
FIG. 4 is a view of the susceptor of FIG. 2A with a schematic representation of a chamber wall surrounding the susceptor.

For example, referring to FIG. 4, a dual heater element susceptor 137 having heater elements 24 and 26 in the plate 20 was employed in a PECVD chamber (AKT 3500 PECVD Chamber, AKT, Inc., Tokyo, Japan) for the deposition of thin layers of TEOS on glass substrates having dimensions of 550 mm×650 mm. TEOS liquid was used as a source material. Thermocouples 28 were used to provide feedback for independent control of the temperatures of the heating elements 24 and 26, as described above. After mounting the substrate on the susceptor in the chamber and sealing the chamber, TEOS was flowed into the chamber at a flow rate of 300 sccm, helium was inputted at 100 sccm and oxygen was inputted at 5000 sccm. RF energy of 13.56 MHz was inputted at a power density of about 0.45 W/cm$^2$ and a spacing of 500 mils was used to generate a plasma for performing the deposition. The deposition process was carried out for 60 seconds and repeated at various inner/outer temperature ratios which are noted in Table 1 below.

TABLE 1

| Inner Temperature | Outer Temperature | Average Film Thickness | Film Uniformity |
| --- | --- | --- | --- |
| 390 C. | 380 C. | 927Å | 10.1% |
| 390 C. | 390 C. | 895Å | 8.6% |
| 390 C. | 400 C. | 900Å | 5.0% |
| 390 C. | 410 C.* | 897Å | 4.1% |

Figure 6:
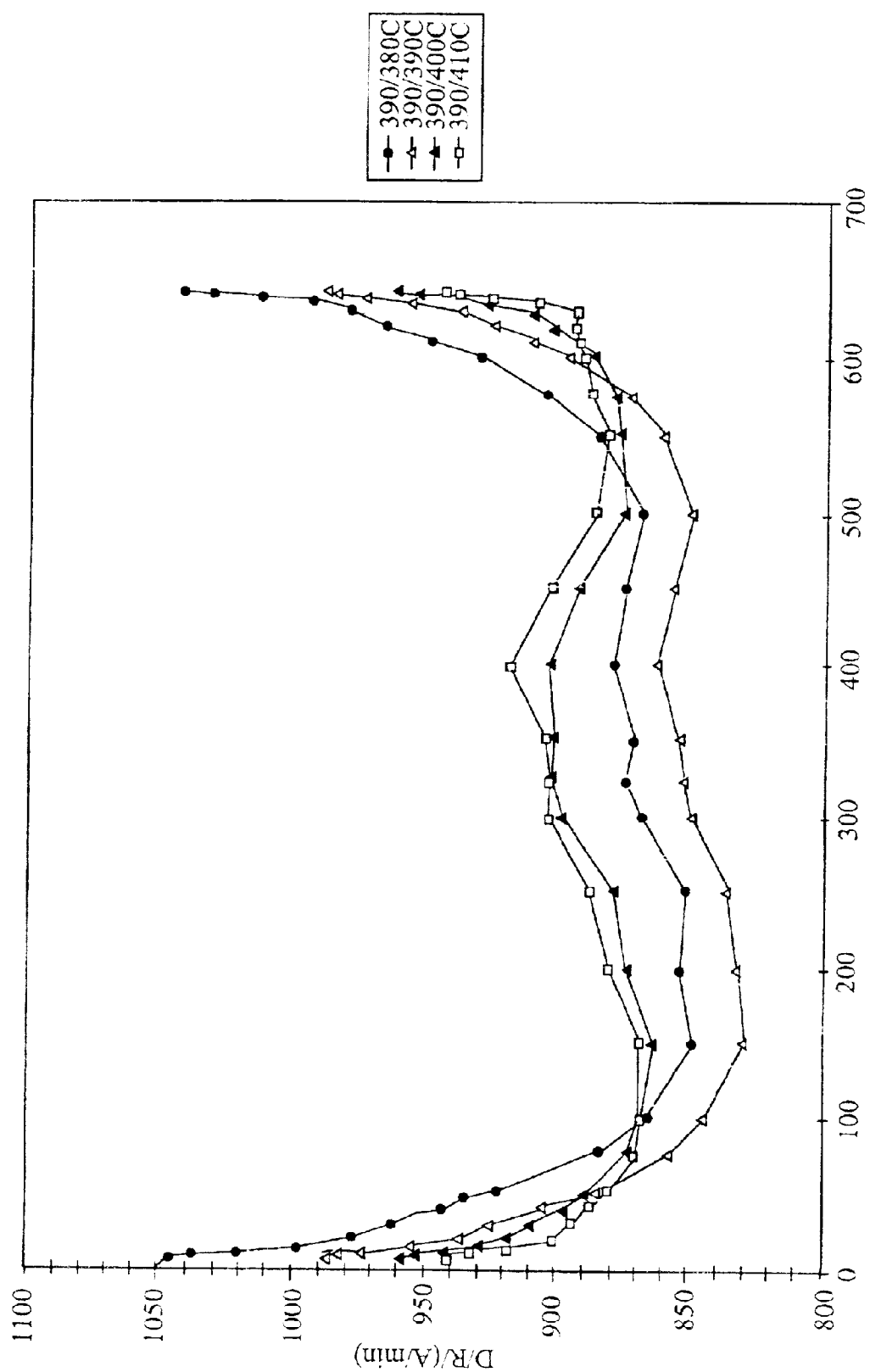
FIG. 6 is a graph showing the relationship between film thickness uniformity and various temperature profiles of a substrate upon which the films are being deposited.

The deposition rate was generally about 1000 Å/min. The results of the thickness measurements per minute across the length of the film (in a line through the center of the film) are shown graphically in FIG. 6, for each of the four runs shown in Table 1.

A clear relationship is shown between temperature and film thickness uniformity, where the lower the temperature is at the periphery of the substrate, the thicker is the film formation there. It is noted that by correcting the temperature of the periphery of the substrate to equal that of the inner temperature, the film uniformity was only improved slightly (as compared to an example where the periphery is colder). By increasing the temperature of the periphery to 400° C. with the inner temperature at 390° C., a dramatic improvement in film uniformity was measured. By increasing the outer temperature still further to 410° C. with an inner temperature of 390° C. a still further improvement in film uniformity was recorded. Particularly, a dramatic decrease in the thickness of the peripheral portions of the layer resulted by increasing the outer temperature above that of the inner temperature.

The results of depositions of thin layers of organosilicates using TEOS on glass substrates having dimensions of 730 mm×920 mm are shown below in Table 2. TEOS liquid was used as a source material. Thermocouples 28 were used to provide feedback for independent control of the temperatures of the heating elements 24 and 26, as described above. After mounting the substrate on the susceptor in the chamber and sealing the chamber, TEOS was flowed into the chamber at a flow rate of 700 sccm, helium was inputted at 240 sccm and oxygen was inputted at 6480 sccm. RF energy of 13.56 MHz was inputted at a power of 1900 Watts and a spacing of 470 mils was used to generate a plasma for performing the deposition. The deposition process was carried out for 600 seconds in each of the first two runs shown in Table 2 and for 700 seconds in the third run.

TABLE 2

| Inner Temperature | Outer Temperature | Average Film Thickness | Film Uniformity |
| --- | --- | --- | --- |
| 400 C. | 420 C. | 8494Å | 6.4% |
| 430 C. | 450 C. | 6731Å | 6.7% |
| 450 C. | 460 C. | 8292Å | 6.0% |

While the present invention has been described with reference to the specific embodiments thereof, it should be understood by those skilled in the art that various changes may be made and equivalents may be substituted without departing from the true spirit and scope of the invention. For example, although in some specific examples, the power density of the RF energy used to generate the plasma was about 0.45 W/cm$^2$, it is noted that power densities of about 0.3 to 0.7 W/cm$^2$ may be successfully employed, more preferably about 0.4 to 0.5 W/cm$^2$. In addition, many modifications may be made to adapt a particular situation, material, composition of matter, process, process step or steps, to the objective, spirit and scope of the present invention. All such modifications are intended to be within the scope of the claims appended hereto.

That which is claimed is:

1. A method of controlling thickness uniformity of a film deposited on a substrate in a processing chamber, said method comprising the steps of:
controlling a temperature of at least two distinct locations on the substrate including (i) a perimeter area of a surface of the substrate and (ii) an inner area of the surface of the substrate that is inside the perimeter area of the surface; and
maintaining the temperature of the perimeter area of the surface of the substrate within a range between about 10° C. less than the temperature of the inner area to about 20° C. higher than the temperature of the inner area; and
depositing the film, wherein the film has a film thickness uniformity less than or equal to about 10%.

2. The method of claim 1, wherein
the temperature of the perimeter area of the surface of the substrate is controlled by a first heater element in a portion of the susceptor that is underlying the perimeter area of the substrate, and
the temperature of the inner area of the surface of the substrate is controlled by a second heater element in a portion of the susceptor that is underlying the inner area,
said controlling comprising maintaining the temperature of the perimeter area of the surface of the substrate within a range of about 380° C. to about 410° C. while maintaining the inner area of the surface of the substrate at about 390° C.

3. The method of claim 2, wherein
the film is produced from a precursor comprising TEOS, and
said controlling comprises maintaining the temperature of the perimeter area at about 390° C. while maintaining the inner area at about 390° C.

4. The method of claim 2, wherein
the film is produced from precursor comprising TEOS, and
said controlling comprises maintaining the temperature of the perimeter area between about 390° C. and about 400° C. while maintaining the inner area at about 390° C.

5. The method of claim 2, wherein
the film is produced from a precursor comprising TEOS, and
said controlling comprises maintaining the temperature of the perimeter area between about 400° C. and about 410° C. while maintaining the inner area at about 390° C.

6. The method of claim 2, wherein
the film is produced from a precursor comprising TEOS, and
said controlling comprises maintaining the temperature of the perimeter area at about 410° C. while maintaining the inner area at bout 390° C.

7. The method of claim 1, wherein
the temperature of the perimeter area of the surface of the substrate is controlled by a first heater element in a portion of the susceptor that is underlying the perimeter area of the substrate, and
the temperature of the inner area of the surface of the substrate is controlled by a second heater element in a portion of the susceptor that is underlying the inner area,
said controlling comprising maintaining the temperature of the perimeter area of the surface of the substrate within a range of about 350° C. to about 460° C. while maintaining the inner area of the surface of the substrate within a range of about 340° C. to about 450° C.

8. The method of claim 7, wherein said depositing comprises depositing on the substrate a film from a precursor comprising TEOS.

9. The method of claim 1, wherein said depositing comprises depositing on the substrate a film from a precursor comprising TEOS.

10. The method of claim 1, wherein said depositing is by chemical vapor deposition, physical vapor deposition, plasma enhanced chemical vapor deposition or rapid thermal processing.

11. The method of claim 1, wherein paid depositing further comprises
inputting TEOS, He, and Oxygen into a PECVD chamber; and
applying RF energy to generate a plasma.

12. The method of claim 11, wherein said TEOS is inputted into said processing chamber at about 300 sccm, said He is inputted at about 100 sccm, said oxygen is inputted at about 5000 sccm, and said RF energy is inputted at a power density of about 0.3 to 0.7 W/cm2.

13. The method of claim 12, wherein said depositing is conducted for about one minute.

14. The method of claim 11, wherein said TEOS is introduced into said processing chamber at a flow rate about 700 sccm.

15. The method of claim 11, wherein said He is introduced into said processing chamber at a flow rate about 240 sccm.

16. The method of claim 11, wherein said RF energy during said depositing provides a power density of about 0.3 W/cm2 to about 0.7 W/cm2.

17. The method of claim 11, wherein said depositing is conducted for about 600 seconds to about 700 seconds.

18. The method of claim 1, wherein the film is an organosilicate film.

19. The method of claim 1, wherein said processing chamber is a rapid thermal processing chamber, a physical vapor deposition chamber, a plasma enhanced chemical vapor deposition chamber or a chemical vapor deposition chamber.

20. The method of claim 1, wherein the substrate is glass or silicon.

21. The method of claim 1, wherein the substrate has a length that is greater than 300 millimeters and a width that is greater than 300 millimeters.

22. The method of claim 1, wherein the substrate has a length between 550 millimeters and 1.0 meter and a width between 650 millimeters and 1.2 meters.

23. The method of claim 1, wherein the film is deposited at deposition rate of about 850 Å/minute to about 1050 Å/minute.

24. The method of claim 1, wherein said processing chamber has a power density between about 0.3 W/cm2 and about 0.7 W/cm2 during said depositing step.

25. The method of claim 1, wherein the film is deposited using gaseous materials selected from the group consisting of SiH4, H2, N2, NH3, PH3, CH4, Si2H6 and O2.

26. The method of claim 1, wherein the film is metallic or silicon.

27. The method of claim 1, wherein the film forms part of a dielectric layer, a semiconductor layer, or a metal layer.

28. A method of depositing a film on a substrate, comprising the steps of:

providing a susceptor within a process chamber;

providing first and second heating elements respectively positioned so as to heat first and second portions of the susceptor, wherein the second portion of the susceptor is adjacent the perimeter of the susceptor, and wherein the first portion of the susceptor is radially inward of the second portion of the susceptor;

providing first and second thermocouples respectively coupled to the first and second portions of the susceptor, wherein each thermocouple produces a temperature reading;

supporting a substrate on the susceptor;

supplying a precursor material into the process chamber so as to deposit a film on the substrate; and concurrently with the supporting step and the supplying step, controlling the first and second heating elements so that the temperature reading of the second thermocouple is in the range of 10 degrees C. to 20 degress C. higher than the temperature reading of the first thermocouple and so that said film has a thickness uniformity less than or equal to ten percent.

29. A method according to claim 28, wherein the precursor material includes TEOS.

30. A method according to claim 28, wherein the precursor material includes an organosilicate material.

31. A method according to claim 28, wherein the controlling step comprises:

controlling the first and second heating elements so that the temperature reading of the second thermocouple exceeds the temperature reading of the first thermocouple by an amount great enough so that said film deposited on the substrate has a uniformity of thickness less than or equal to 6.7 percent.

32. A method according to claim 28, wherein the controlling step comprises:

controlling the first and second heating elements so that the temperature reading of the second thermocouple exceeds the temperature reading of the first thermocouple by an amount great enough so that said film deposited on the substrate has a uniformity of thickness less than or equal to 4.1 percent.

33. A method according to claim 28, wherein the controlling step comprises:

controlling the first and second heating elements so that the temperature reading of the second thermocouple exceeds the temperature reading of the first thermocouple by an amount that improves the uniformity of the thickness of said film relative to the uniformity of the thickness of a film that would be produced if the temperature readings of the first and second thermocouples were equal during the supplying step.

34. A method according to claim 28, further comprising the step of:

providing a heater controller connected to supply a first electrical current to the first heating element and a second electrical current to the second heating element;

wherein the first and second thermocouples are connected to provide feedback to the controller.

35. A method of depositing a film on a substrate, comprising the steps of:

providing a susceptor with a process chamber;

providing first and second heating elements respectively positioned so as to heat first and second portions of the susceptor, wherein the second portion of the susceptor is adjacent the perimeter of the susceptor, and wherein the first portion of the susceptor is radially inward of the second portion of the susceptor;

providing first and second thermocouples respectively coupled to the first and second portions of the susceptor, wherein each thermocouple produces a temperature reading;

supporting a substrate on the susceptor;

supplying a precursor material into the process chamber so as to deposit a film on the substrate; and concurrently with the supporting step and the supplying step, controlling the first and second heating elements so that the temperature reading of the second thermocouple is 10 to 20 degrees C. higher than the temperature reading of the first thermocouple and so that said film deposited on the substrate has a uniformity of thickness less than or equal to 6.7 percent.

36. A method according to claim 35, wherein the controlling step comprises:

controlling the first and second heating elements so that the temperature reading of the second thermocouple exceeds the temperature reading of the first thermocouple by an amount great enough so that said film deposited on the substrate has a uniformity of thickness less than or equal to 4.1 percent.

37. A method according to claim 35, wherein the precursor material includes TEOS.

38. A method according to claim 35, wherein the precursor material includes an organosilicate material.

39. A method according to claim 35, further comprising the step of:

providing a heater controller connected to supply a first electrical current to the first heating element and a second electrical current to the second heating element;

wherein the first and second thermocouples are connected to provide feedback to the controller.

* * * * *